United States Patent [19]

Turnbull

[11] Patent Number: 5,122,666

[45] Date of Patent: Jun. 16, 1992

[54] PYROELECTRIC AND OTHER INFRARED DETECTION DEVICES WITH THIN FILMS

[75] Inventor: Andrew A. Turnbull, Reigate, England

[73] Assignee: U.S. Philips Corp., New York, N.Y.

[21] Appl. No.: 581,829

[22] Filed: Sep. 12, 1990

[30] Foreign Application Priority Data

Sep. 13, 1989 [GB] United Kingdom ............... 8920677
Jun. 22, 1990 [GB] United Kingdom ............... 9013941

[51] Int. Cl.⁵ ............................................. G01J 5/20
[52] U.S. Cl. ............................ 250/338.3; 250/338.1; 250/338.2; 250/349
[58] Field of Search ............ 250/338.3, 338.1, 349, 250/338.2

[56] References Cited

U.S. PATENT DOCUMENTS

| | | | |
|---|---|---|---|
| 4,425,502 | 1/1984 | Hall et al. | 250/338.3 |
| 4,704,534 | 11/1987 | Turnbull | 250/338.3 |
| 4,806,763 | 2/1989 | Turnbull | 250/338.3 |
| 4,815,199 | 3/1989 | Jenner et al. | 250/338.3 |

FOREIGN PATENT DOCUMENTS

0354369 2/1990 European Pat. Off. .

Primary Examiner—Carolyn E. Fields
Assistant Examiner—James Beyer
Attorney, Agent, or Firm—William L. Botjer

[57] ABSTRACT

An infrared detection device, e.g. for the 8 to 14 micrometer waveband, comprises a Langmuir-Blodgett or other very thin film (10) having pyroelectric or other temperature-dependent characteristics. At least one detector element having opposite electrical conductors (21 and 22) is formed in the film (10). The film (10) which may have a support layer (15) is mostly free of contact with a mount arrangement (25) which supports the film (10) in a very low thermally-conductive manner. In accordance with the present invention, the film (10) is very thin, but very efficient absorption of the radiation (31) is obtained in the following manner: the facing surface (26) of the mount arrangement (25) is reflective for the radiation (31); the sum of the optical thicknesses of the film (10), of any support layer (15) and (d) of a gap (28) forming the multiple layer detector-element structure along the radiation path to the reflector (26) is approximately one quarter of a selected wavelength (e.g. 9.6 micrometers) in the range to be detected; and the conductors (21 and 22) each comprise a resistive layer providing a sufficient resistance per square (Z1 and Z2, e.g. of twice the characteristic impedance of free space) as to absorb a substantial proportion of the incident radiation (31) and reflected radiation (32) in the wavelength range. Spaced supporting elements (252) below the film (10) can support the film (10) over the reflector (26) with a well-defined small gap (28) and carry an electrical connection to the second conductor(s) (22) below the film.

9 Claims, 5 Drawing Sheets

PYROELECTRIC AND OTHER INFRARED DETECTION DEVICES WITH THIN FILMS

BACKGROUND OF THE INVENTION

This invention relates to infrared detection devices for detecting infrared radiation in a given wavelength range (for example 8 to 14 μm wavelength) and comprising a flexible film having a temperature-dependent characteristic. The film may have, for example, pyroelectric and/or ferroelectric properties, or it may comprise a liquid-crystal material. Such a device in accordance with the present invention may be used in, for example, a thermal-radiation sensing system possibly for intruder detection purposes or in a comparatively inexpensive infrared camera or other thermal-imaging equipment.

One problem associated with such infrared radiation detection devices is ensuring sufficient absorption of incident radiation at the wavelengths of interest. Pyroelectric and/or ferroelectric materials suitable for detector elements (and also liquid-crystals) often have relatively low absorption over at least part of the wavelength range for which they are desired to operate. In order to reduce particularly its thermal capacitance as well as its thermal conductance to the surroundings, it is desirable for the film (and any support layer) to be very thin. However, the thinner the film material, the lower will be the overall absorption of the incident radiation by the film material.

Published European patent application EP-A- 0 269 161 which corresponds to U.S. Pat. No. 4,806,763 discloses an infrared detection device for detecting infrared radiation in a given wavelength range and comprising at least one detector element having a multiple-layer structure along the path of the radiation, which multiple-layer structure comprises a flexible film having a (pyroelectric) temperature-dependent characteristic; first and second electrical conductors of the detector element are present at respective opposite first and second faces of the film; the first conductor at the first face facing the incoming radiation comprises a resistive layer providing a sufficient effective resistance per square as to absorb a substantial proportion of incident radiation in said wavelength range; and a reflector which faces the second face of the film is present behind the film to reflect radiation transmitted by the film.

In the device disclosed in EP-A- 0 269 161, the reflector is formed by the second conductor having a sufficiently low electrical resistance per square as to reflect the radiation at the second face of the film back towards the absorbing first conductor layer. The film is supported on a mount arrangement with at least most of the area of the second face of the detector element(s) free of contact with the mount arrangement and separated by a gap from a facing surface of the mount arrangement. This mount arrangement reduces thermal conduction to and from the detector element(s) and so enhances the temperature response of the film to the incident absorbed radiation.

In this known device of EP-A- 0 269 161 the radiation absorption for a polymer pyroelectric film is increased in order to improve the sensitivity of the device. This is achieved by giving the first conductor a suitable electrical resistance per square substantially to absorb the incident radiation and by selecting the thickness of the film to reduce reflection of the radiation. Reflection is a minimum at wavelengths for which the optical thickness of the film (i.e. the product of its physical thickness and its refractive index) is an odd number of quarter wavelengths. The greatest bandwidth over which reflection is reduced is obtained by making the optical thickness equal to substantially one quarter of a selected wavelength. This wavelength is suitably selected bearing in mind that reflection increases fairly rapidly to a maximum as the wavelength of the incident radiation decreases from the selected value to half the selected value but increases much less rapidly as the wavelength increases from the selected value, and taking into account the spectral absorption characteristics of the material of the film and, to some extent, preceding optical elements such as a window of the device. When the detector device is intended to be used for detecting infrared radiation characteristic of a human body (for example in an intruder detection system) or other room-temperature objects, the wavelength range of interest is approximately 5 to 15 μm (micrometers), and it is chosen to maximise absorption of radiation by the resistive conductor layer at a wavelength of 8 μm. In this case, the optical thickness of the film is selected to be substantially one quarter of this wavelength, i.e. to be approximately 2 μm.

The conductor at the first face of the device film of EP-A- 0 269 161 is immediately preceded by a space and is chosen to have a resistance per square value of approximately 377 ohms (this being the characteristic impedance of free space) to optimise absorption of radiation. The conductor layer at the second face of the pyroelectric film is reflective with a resistance per square adjacent the film of the order of 5 ohms or less.

Published United Kingdom patent application GB-A- 2 173 038 which corresponds to U.S. Pat. No. 4,704,534 and European patent application EP-A- 0 272 731 which corresponds to U.S. Pat. No. 4,806,762 disclose other infrared detection device structures in which the first conductor is given a suitable resistance per square to absorb the incident radiation and is preceded by one or more dielectric support layers of quarter-wavelength thickness. The whole contents of EP-A- 0 269 161, EP-A- 0 272 731 and GB-A-2 173 038 are hereby incorporated herein as reference material. The structures disclosed in these three published patent applications provide very efficient absorption of the infrared radiation to be detected. In the specific examples given, the optical thickness of the pyroelectric material is about 2 μm (a quarter of a wavelength) in EP-A- 0 269 161 and an order of magnitude larger in EP-A- 0 272 731 and GB-A-2 173 038.

In order to produce infrared detector elements with low thermal mass, short response time, wide spectral response, and good sensitivity, there is considerable interest in the use of Langmuir-Blodgett films with ferroelectric and/or pyroelectric properties and of liquid-crystal films. Unlike conventional ferroelectric and/or pyroelectric materials, Langmuir-Blodgett films do not require poling. Published PCT application WO-A-87/00347 discloses particular examples of Langmuir-Blodgett films with pyroelectric and ferroelectric properties, and published United Kingdom patent application GB-A-2 163 566 discloses some examples of liquid-crystal films used for infrared detection devices. The whole contents of both WO-A-87/00347 and GB-A-2 163 566 are hereby incorporated herein as reference material. In both these cases, the optical thickness of the films is much smaller than a quarter of a wavelength in the wavelength range being detected. Thus, for example, in typical cases the Langmuir-Blodgett films and liquid-crystal films may have a physical thickness of between 0.05 μm and 0.5 μm, and so their optical thickness may be an order of magnitude thinner than the pyroelectric polymer films in EP-A-0 269 161 and two orders of magnitude thinner than the pyroelectric elements in GB-A-2 173 038 and EP-A- 0 272 731.

SUMMARY OF THE INVENTION

Figure 1:
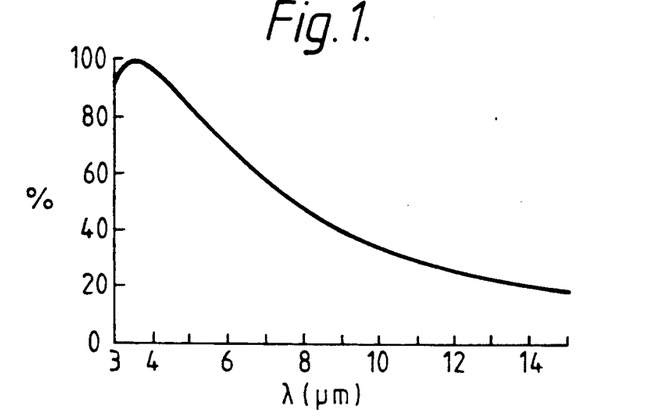
FIGS. 1 and 2 are graphs illustrating radiation absorption characteristics for novel detector device structures devised by the present inventor but not in accordance with the present invention.
Figure 2:
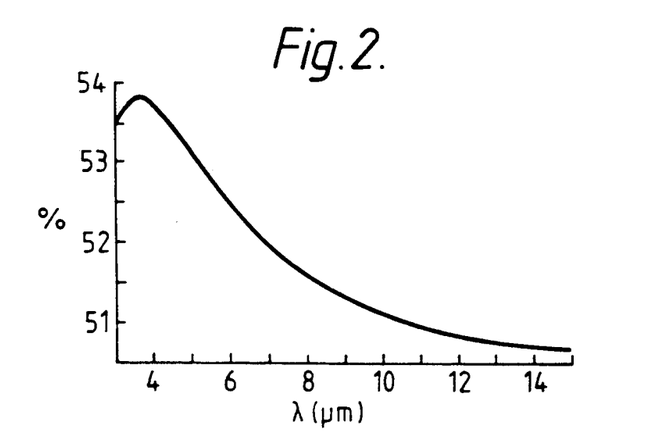

In trials before devising the present invention, the applicant has attempted to adjust the resistance per square of the first conductor facing the radiation, so as to increase absorption for a thin film detector. FIG. 1 shows the radiation absorption characteristic as calculated for a 0.5 μm thick film (with an optical thickness of 0.9 μm) having a first (front) conductor with a resistance per square of 377 ohms and a second (back) conductor which is reflective with a resistance per square of 2 ohms. As illustrated in FIG. 1, the absorption is low for 5 μm to 15 μm wavelength range, and especially low in the 8 μm to 14 μm waveband. Attempts were made by the applicant to improve the absorption characteristic by adjusting the resistance value of both the first and second conductors. FIG. 2 illustrates the characteristic calculated for the same film with both the first and second conductors having a resistance per square of 400 ohms. These attempts still led to absorption in the 8 μm to 14 μm being no better than about 52% at best. Furthermore these results are for a 0.5 μm thick film, and the absorption deteriorates as the film thickness is further reduced.

According to the present invention there is provided an infrared detection device for detecting infrared radiation in a given wavelength range comprising at least one detector element having a multiple-layer structure along the path of the radiation, which multiple-layer structure comprises a flexible film having a temperature-dependent characteristic, and first and second electrical conductors of the detector element at respective opposite first and second faces of the film, wherein the first conductor at the first face facing the incoming radiation comprises a resistive layer providing a sufficient effective resistance per square as to absorb a substantial proportion of incident radiation in said wavelength range, and wherein a reflector which faces the second face of the film is present behind the film to reflect radiation transmitted by the film, the device being characterised in that the reflector is separated from the second conductor at the second face of the film by a separation along the path of the radiation, in that the optical thickness of the film between the first and second conductors is less than one quarter of a selected wavelength of said wavelength range, in that the sum of the optical thicknesses of the multiple-layer structure (including the film and said separation) along the radiation path to the reflector is approximately one quarter of said selected wavelength, and in that the second conductor facing the reflective surface comprises a resistive layer providing a sufficient effective resistance per square as to absorb a substantial proportion of reflected radiation in said wavelength range.

Even though the optical thickness of the film between the first and second conductors is less than one quarter of the selected wavelength, it is found that significantly higher absorption (approaching that obtained with the previous quarter-wavelength thick structures) can be achieved by constructing the detection device in this manner in accordance with the invention. The separation between the second conductor and the reflector may have an optical thickness of about one quarter of the selected wavelength, but to achieve optimum absorption it may have an even smaller thickness, depending on the optical thickness of the film and whether a support layer is present in front of the film. Calculations indicate that instead of a resistance per square of approximately Zo (where Zo is the characteristic impedance of free space), optimum absorption can be obtained in this device structure with its separated reflector when the resistance per square of the resistive layers of the first and second conductors is chosen to be approximately equal to 2.Zo, assuming that the resistive layers of the first and second conductors are immediately preceded by a space (either vacuum or gas, depending on the ambient inside the device) in the respective directions of the incoming radiation and reflected radiations. Examples will be described later, illustrating the effect of varying these parameters of the layer resistance, gap thickness and film thickness, but considerable tolerance on these parameters seems possible while still achieving very good radiation absorption in the 8 μm to 14 μm waveband. This permits these parameters in the device structure in accordance with the invention to be chosen to accommodate also technological demands and preferences.

The temperature-dependent detector film may be freely supported in a mount arrangement such that, at least for the most part, the resistive layers of both the first and second conductors in the respective directions of the incoming radiation and reflected radiation are immediately preceded by a space. The space preceding the second conductor may be a gap separating the second conductor from the reflector, and so in this case the sum of optical thicknesses of the film between the first and second conductors and of the gap between the second conductor and the reflector may be approximately one quarter of a selected wavelength of said wavelength range. However modifications are also possible incorporating one or more support layers for the film. Thus, at least one of the first and second conductors in the respective directions of the incoming radiation and reflected radiation may be immediately preceded by an electrically-insulating support layer which supports the film and which forms part of the multiple-layer structure. Such a support layer may have a thickness which is larger than that of the film (and which may be for example at most 0.5 micrometers), and in this case also the multiple-layer structure preferably includes a space-forming gap in front of the reflector. The provision of the gap in these mount arrangements and the maintenance of a small thickness (0.5 μm or less) for the film and any support layer reduces thermal capacity and thermal conduction to and from the detector element(s) and so enhances the temperature response of the film to the incident absorbed radiation.

The present invention also provides an advantageous structure for supporting and mounting the thin film (whether or not on a support layer) over the reflector while also making connection to the second conductor(s) at the second face of the film. Such a preferred device structure in accordance with the invention is further characterised in that a plurality of spaced supporting elements are present below the film to support the film over the reflector with a gap, which gap provides the separation between the reflector and at least most of the area of the second conductor, and in that at least one of the supporting elements carries an electrical connection for the second conductor below the film. This structure may be used with films having a single detector element or a small number of detector elements. However it is particularly useful for forming individual lower connections to a large 2-d array of detector elements while also supporting the large-area film with a small but well-defined gap as the separation between the detector elements and the reflector. The gap may be formed by a depression in a substrate, upstanding parts of which provide the supporting elements on which the detector element film is mounted. Depending on the nature of the substrate material, this depression may be formed by etching, by machining or other cutting, or by moulding, or in some other manner. In order to support a wide film area with the desired optical gap thickness, at least some of the supporting elements may be formed at the reflector as bumps distributed over the second face of the film. The bumps may be formed by deposition on a substrate or by cutting into, or etching or moulding the substrate surface or a surface layer; in the case of an array, at least some of these bumps can be fabricated so as to carry an electrical connection to individual second conductors of the array.

A support layer and/or a substrate may be of electrically and thermally insulating material, for example for supporting a liquid-crystal film which does not require electrical connections. In the case of a pyroelectric and/or ferroelectric film, a support layer and/or even a substrate may be of electrically and thermally insulating material and may carry one or more electrical connections from/to the second conductor(s) of the film. However, mount arrangements may also be designed in which the substrate is of electrically conductive material.

BRIEF DESCRIPTION OF THE DRAWINGS

These and other features in accordance with the invention are illustrated, by way of example, in specific embodiments of the invention now to be described with reference to the accompanying diagrammatic drawings, in which.

It should be noted that all the drawings are diagrammatic. The cross-sections of FIGS. 3,7,8,12 and 13 are not drawn to scale, but relative dimensions and proportions of parts of these Figures have been shown exaggerated or reduced in size for the sake of clarity and convenience in the drawings. The same reference signs as used in one embodiment are generally used for referring to corresponding or similar parts in other embodiments. It should also be noted that the graphs of FIGS. 1,2,4 to 6, 9 to 11 and 14 (which show absorption as a percentage plotted against wavelength $\lambda$) are based on calculations using a simplified computer model. The model assumes that the spectral transmission/absorption of the radiation by the film 10 and the refractive index of the film 10 (and of any support layer 15) are both constant over the given wavelength range; these simplifying assumptions are normally acceptable in modelling embodiments of the present invention, because the film 10 (and support layer 15) is so very thin.

DETAILED DESCRIPTION OF PREFERRED EMBODIMENTS

Figure 3:
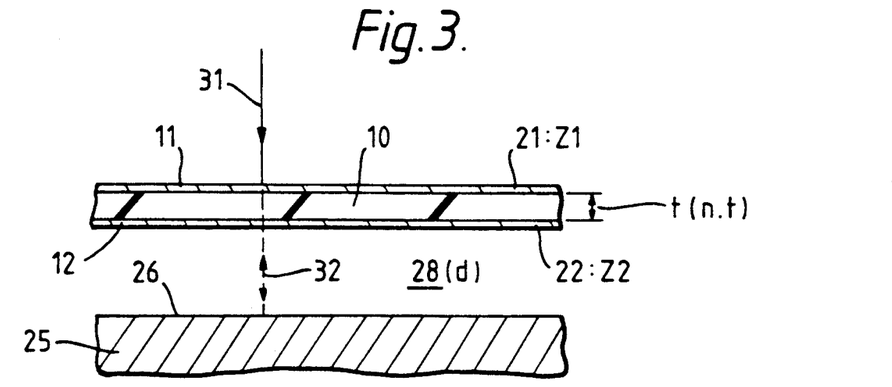
FIG. 3 is a simplified representation of part of an infrared detector device in accordance with the present invention, illustrating various parameters.
Figure 7:
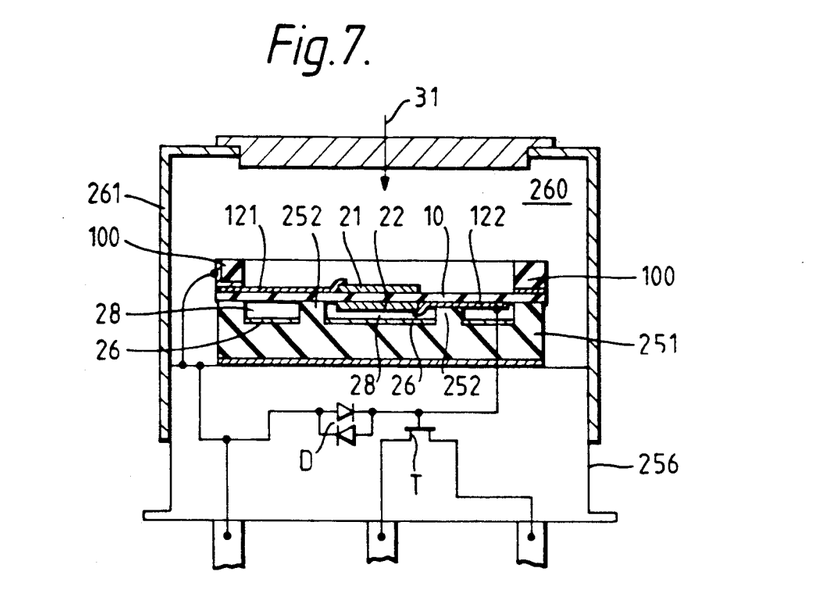
FIG. 7 is a partial cross-sectional view and partial circuit diagram of one specific detector device in accordance with the invention, and having a single detector element.
Figure 8:
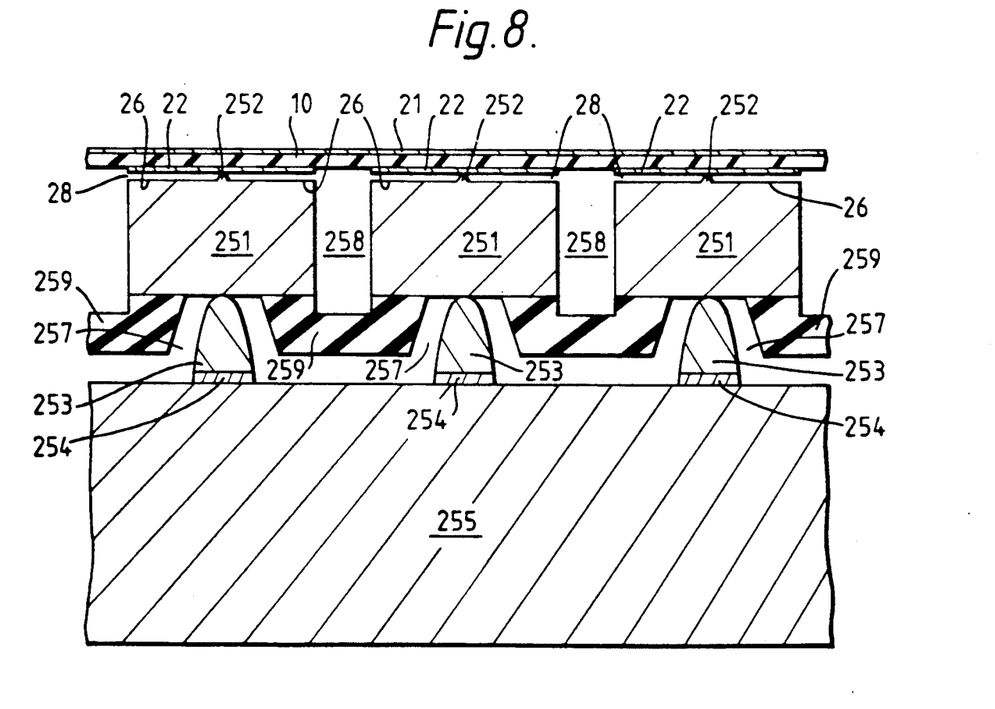
FIG. 8 is a cross-sectional view of part of another specific detector device in accordance with the invention, and having an array of detector elements.
Figure 12:
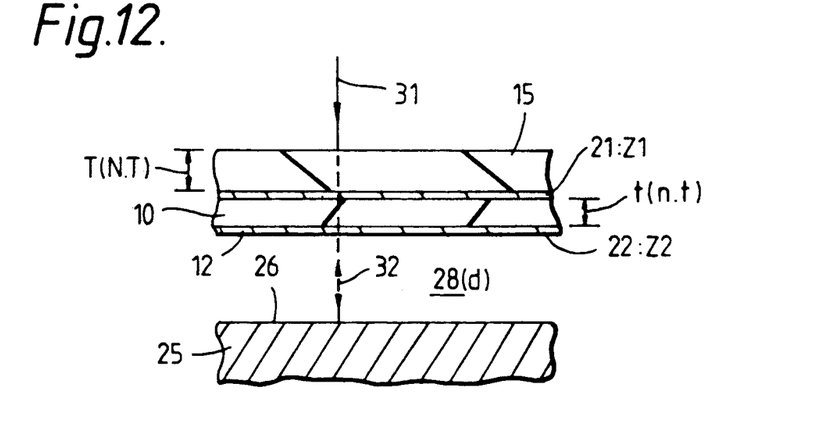
FIGS. 12 and 13 are simplified representations of part of an infrared detector device in accordance with the present invention having such a supported film.
Figure 13:
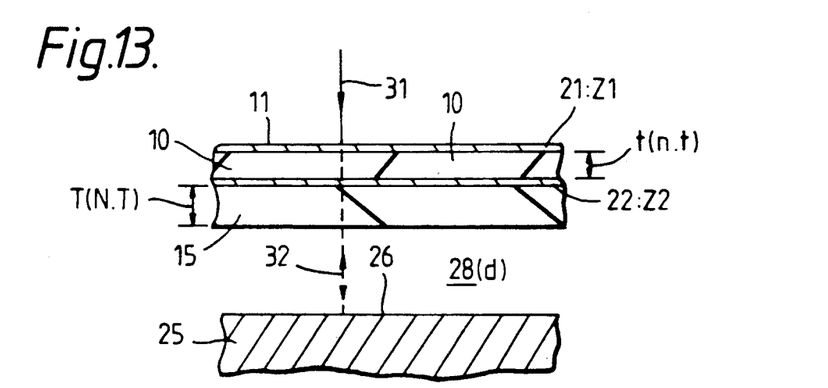

FIGS. 7 and 8 illustrate two specific infrared detection devices for detecting infrared radiation in a given wavelength range, for example in the range of 5 $\mu$m to 15 $\mu$m, and especially in the 8 $\mu$m to 14 $\mu$m waveband. FIGS. 3,12 and 13 are simplified representations of a detector element part of such a device in accordance with the invention. The device comprises a flexible film 10 having a temperature-dependent characteristic, for example utilizing pyroelectric and/or ferroelectric properties. The film 10 forms part of a multiple-layer structure to provide at least one detector element. First and second electrical conductors 21 and 22 of the/each detector element are present at respective first and second faces 11 and 12 of the film 10. The first conductor 21 facing the incoming radiation 31 comprises a resistive layer providing a sufficient effective resistance per square Z1 as to absorb a substantial proportion of incident radiation 31 (and 32) in the given wavelength range. The film 10 is supported on a mount arrangement 25. In the device structure of FIGS. 3 and 12, at least most of the area of the second face 12 of the film 10 is free of contact with the mount arrangement and separated by a gap 28 from a facing surface 26 of the mount arrangement 25. In the device structure of FIG. 13, the gap 28 is present between a support layer 15 of the film 10 and the facing surface 26 of the mount arrangement 25. In the notation used in FIGS. 3,12 and 13, the film 10 has a physical thickness t and a refractive index n so that its optical thickness is n·t. The gap 28 has a physical thickness d and is assumed to be a vacuum, or air or another gas having a refractive index of 1 so that its optical thickness is also d. The optical thickness of the extremely thin conductors 21 and 22 can be ignored.

FIG. 3 illustrates the simplest of the three illustrated device structures, in which the or each detector element comprises a multiple-layer structure in the form of the film 10 and its conductors 21 and 22 and the gap 28. In accordance with the present invention, the facing surface 26 separated from the conductor 22 is reflective for radiation in the given wavelength range; the optical thickness n·t of the film 10 between the conductors 21 and 22 is less than one quarter of a selected wavelength ($\lambda$s) in the given wavelength range; the sum of the optical thickness n·t and the optical thickness d of the gap 28 between the second conductor 22 and the reflective surface 26 is approximately one quarter of $\lambda$s; furthermore the second conductor 22 (facing the reflector surface 26) comprises a resistive layer providing a sufficient effective resistance per square Z2 as to absorb a substantial proportion of reflected radiation 32 in the given wavelength range.

The film 10 of FIG. 3 may comprise a solid liquid-crystal material, for example, whose molecular orientation and refractive index n varies in known manner with changes in temperature (due to local heating by the absorbed radiation 31,32) so as to change the mode of polarization of light transmitted through or reflected from the film 10. The output of such a liquid-crystal detector element may be read optically using external polarizers, so that there may be no electrical connections to the film 10 in this case, and the electrical conductors 21 and 22 may act merely as optical elements for radiation absorption. In the case of a detector element in which the conductors 21 and 22 provide electrical connections (for example with capacitor elements formed on a pyroelectric and/or ferroelectric film 10), these electrodes 21 and 22 are also important as optical elements for radiation absorption. Thus, in both cases when designing the device structure with a particular film 10 of optical thickness n·t less than a quarter wavelength ($\lambda s/4$), the values of resistance Z1 and Z2 of the two layers 21 and 22 and the thickness d of the gap 28 are important parameters.

Figure 4:
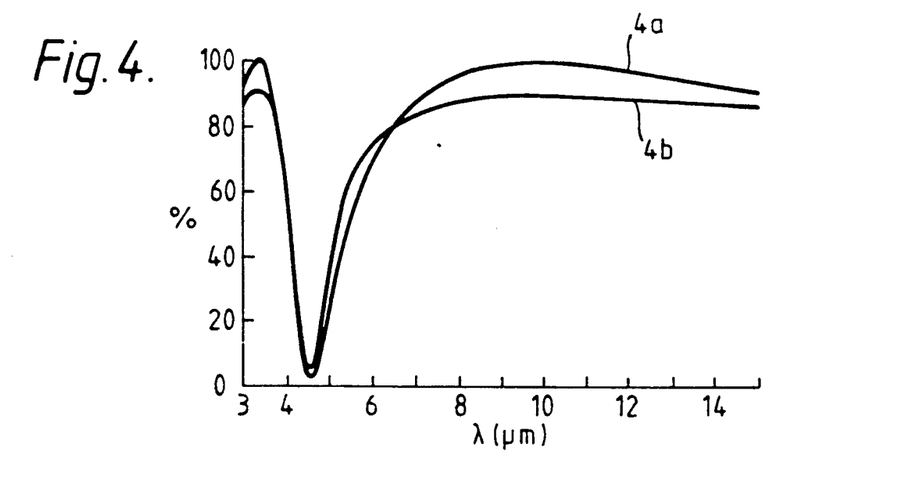
FIGS. 4 to 6 are graphs illustrating radiation absorption characteristics for detector device structures in accordance with the present invention, with different values of the various parameters of FIG. 3.
Figure 5:
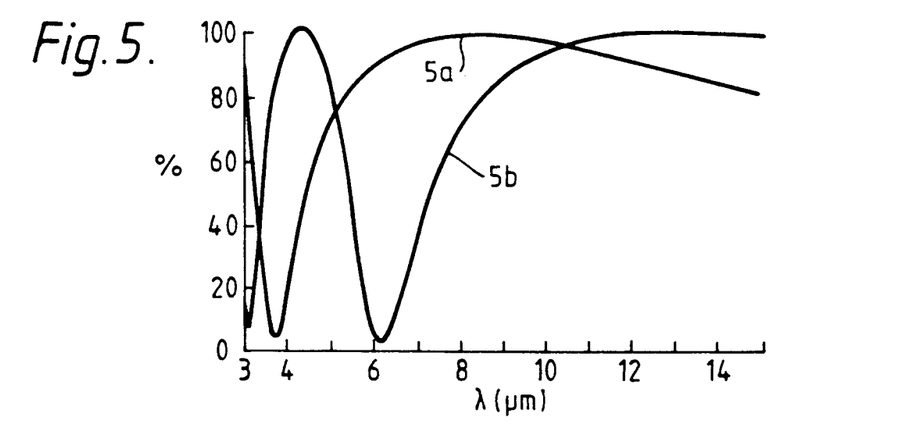
Figure 6:
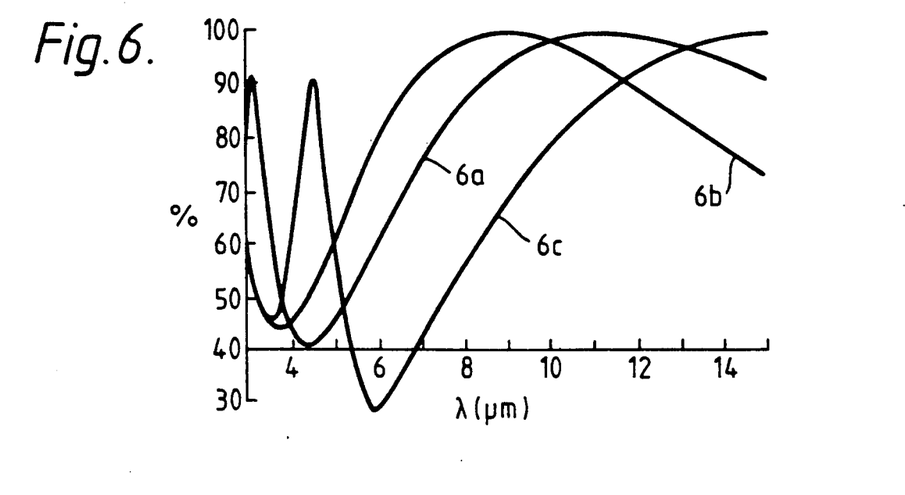

FIGS. 4 to 6 illustrate the effect of varying these parameters on the absorption characteristic of the FIG. 3 device. The plots of FIGS. 4 to 6 are based on computer calculations which assume that the radiation 31 and 32 is substantially perpendicular to the exposed surfaces, that the sequence of surfaces in the FIG. 3 structure interacting with the radiation are all parallel, that the resistance layer 21 is preceded by free-space, and that the gap 28 is free space. An arbitrary value of 2 ohms has been chosen for the resistance per square of the reflective surface layer 26, and an arbitrary value of 1.8 has been chosen for the refractive index n of the film 10.

Both for liquid-crystal material films 10 and for Langmuir-Blodgett pyroelectric and/or ferroelectric films 10, the physical thickness t of the film 10 may be in the range of, for example, 0.05 $\mu$m to 0.5 $\mu$m. By way of example, FIGS. 4 and 5 are for the film 10 having a physical thickness t of 0.1 $\mu$m (i.e. an optical thickness of 0.18 $\mu$m), whereas FIG. 6 is for the film 10 having a physical thickness t of 0.5 $\mu$m (i.e. an optical thickness of 0.9 $\mu$m). The values for the different parameters are listed below:

| (i) film thickness t of 0.1 $\mu$m (FIGS. 4 and 5): | | |
|---|---|---|
| curve 4a: | d = 2.22 $\mu$m, | Z1 = Z2 = 754$\Omega$ |
| curve 4b: | d = 2.22 $\mu$m, | Z1 = Z2 = 400$\Omega$ |
| curve 5a: | d = 1.8 $\mu$m, | Z1 = Z2 = 754$\Omega$ |
| curve 5b: | d = 3.0 $\mu$m, | Z1 = Z2 = 754$\Omega$ |
| (ii) film thickness t = 0.5 $\mu$m (FIG. 6): | | |
| curve 6a: | d = 1.5 $\mu$m, | Z1 = Z2 = 754$\Omega$ |
| curve 6b: | d = 1.0 $\mu$m, | Z1 = Z2 = 754$\Omega$ |
| curve 6c: | d = 2.5 $\mu$m, | Z1 = Z2 = 754$\Omega$ |

As can be seen from these curves the maximum absorption is close to 100% when the resistance of the layers 21 and 22 is 754 ohms, i.e. approximately equal to 2.Zo, where Zo is the characteristic impedance of free space. This is unlike the situation in previous quarter-wavelength structures (such as these described in EP-A- 0 269 161, EP-A- 0 272 731 and GB-A-2 173 038) where the optimum resistance for a similar layer 21 is equal to Zo, and where even lower resistance values are adopted if the back conductor 22 is also resistive.

For absorption in the 8 $\mu$m to 14 $\mu$m waveband, these curves show that the optimum value of the air gap 28 is about the curve 4a situation (d = 2.22 $\mu$m) for a 0.1 $\mu$m thick film 10, and about the curve 6a situation (d = 1.5 $\mu$m) for a 0.5 $\mu$m thick film 10. Thus, the optimum thickness d of the air gap 28 depends on the thickness t of the film 10, but in general the optimum optical thickness d is normally less than one quarter of a selected wavelength ($\lambda s$) in the given wavelength range (8 $\mu$m to 14 $\mu$m in this example). This is unlike the situation in previous quarter-wavelength structures (such as those described in EP-A- 0 269 161, EP-A- 0 272 731 and GB-A-2 173 038) where the optimum optical thickness for the individual dielectric films/layers is equal to one quarter of the selected wavelength. Both curve 4a and curve 6a correspond to the situation where the sum of the optical thicknesses (n·t+d) of the film 10 and gap 28 is equal to one quarter of a wavelength $\lambda s$ selected at 9.6 $\mu$m. This 9.6 $\mu$m wavelength is a suitable choice for the 8 $\mu$m to 14 $\mu$m waveband in the situation illustrated in FIGS. 3 to 6, bearing in mind that reflection increases fairly rapidly to a maximum as the wavelength $\lambda$ of the radiation 31 and 32 decreases from the selected value and also increases again (normally more slowly) for wavelengths beyond the selected value. In this situation it is usually preferable to choose $\lambda s$ to be at a wavelength lying in the lower half of the given wavelength range. The spectral absorption characteristics of the film 10 also need to be taken into account, although in many cases this effect of the film 10 is of little significance due to the very small optical thickness n·t of the film 10; normally n·t will be less (even an order of magnitude less, for very thin films 10) than the optical thickness d of the gap 28. In determining the selected wavelength $\lambda s$, the spectral absorption of optics in front of the detector element (for example a lens or a device window or a filter) can also be exploited in conjunction with the absorption characteristics of the FIG. 3 structure so that, whereas in most cases the selected wavelength $\lambda s$ will be within the wavelength range, a selected wavelength $\lambda s$ may be chosen in some cases slightly below the given wavelength range. Curve 6b in FIG. 6 provides an example of a situation where 4(n·t+d) is equal to 7.6 micrometers which is just below the 8 $\mu$m to 14 $\mu$m wavelength range.

As can be seen from the curves 4a and 6a, with the choice of 4(n·t+d) equal to a 9.6 $\mu$m selected wavelength, the absorption of the radiation 31 and 32 over the wavelength range 8 $\mu$m to 14 $\mu$m is substantially maximised and exceeds 90%.

The curves show optimum absorption of the infrared radiation 31 and 32 occurring when the resistance per square of both the layers 21 and 22 is each approximately equal to 2.Zo, i.e. about 754 ohms. In practice, consideration has to be given to the stability of resistance of metal films used to provide the conductors 21 and 22. This stability is a function of the method of metal film deposition and of the surface and bulk properties of the film 10, but experience to date suggests that instances of instability of the resistance value can occur and are more common with high resistance values. It is therefore technologically beneficial to explore the tolerance on resistance value in still achieving a high absorption efficiency. Curve 4b in FIG. 4 shows the effect of reducing Z1 and Z2 from 754 ohms (curve 4a) to a value as low as 400 ohms (i.e. nearly as low as Zo). It can be seen from curve 4b that the absorption efficiency is still very high (at over 90%) over the wavelength range of 8 μm to 14 μm. A similar slight lowering of the absorption characteristic of curve 6a occurs with reduced Z1 and Z2 for the FIG. 6 situation. Therefore, with a view to increasing the stability, it becomes a realistic option to use values of Z1 and Z2 considerably less than the 754 ohms which provides optimum absorption. In order to maintain a high absorption efficiency it is preferable that the resistive layers 21 and 22 immediately preceded by a space provide a resistance per square which is between Zo and approximately 2.Zo. It is not necessary that Z1 should always be the same as Z2. A difference between Z1 and Z2 may even be advantageous, for example when one of the conductors 21 and 22 is immediately preceded by a space while the other conductor 22 or 21 is preceded by a support layer 15 as described hereinafter with reference to FIGS. 12 and 13.

Since the gap 28 has such a small thickness (generally less than λs/4), control of its optical thickness d may be difficult to achieve at least over large areas of the film 10. It is therefore beneficial to explore the tolerance on gap thickness d in still achieving a high absorption efficiency. Comparison of curves 5a and 5b with curve 4a and comparison of curves 6b and with 6a illustrate how variations in the air gap 28 thickness d influence the average absorption. It can be concluded from these comparisons that a variation in d as large as about plus or minus 50% from the optimum value still yields very high absorption and is likely to be acceptable in many device applications. Thus, in the FIG. 3 structure, the maximum optical thickness of the gap 28 itself may even exceed a quarter of the optimum selected wavelength λs for the wavelength range of interest.

The absorption illustrated by the curves in FIGS. 4 to 6 relate to the absorption of the complete optical path, including the reflector 26. Any absorption in the reflector 26 is undesirable since it reduces the energy available for absorption in the detector element layers 10,21 and 22. The resistance of the reflector 26 has been arbitrarily chosen as 2 ohms, since such a low value is readily achievable in practice, for example using a thin layer of evaporated gold. Computer analysis indicates that the maximum absorption in a 2 ohm layer is only about 0.6% over the wavelength range of 8 μm to 14 μm (and rises to about 2% for wavelengths λ between 4 μm and 5 μ). Thus, a 2 ohm metal film can function quite satisfactorily as a reflector having negligible absorption for the wavelength range 5 μm to 15 μm, and especially for the waveband of 8 μm to 14 μl m.

FIG. 7 illustrates one example of use of a FIG. 3 structure for a discrete pyroelectric detector element application, for example in a conventional TO-5 type device can for a domestic intruder detection system. The gap 28 is formed by a depression in a substrate 251 on which the pyroelectric film 10 is mounted.

The film 10 having an optical thickness of less than λs/4 is held taut (but not stretched) on, for example, an insulating ceramic or glass ring 100 to which the periphery of the film 10 is bonded. In a typical example for a domestic intruder detector, the ring 100 and film 10 may have an outer diameter of several millimeters whereas the width of the absorbent conductors 21 and 22 defining the central active-detector area of the film 10 may be, for example, about 0.5 mm or less. The conductors 21 and 22 may be square, for example of 0.5 mm size, defining a square shape pyroelectric detector elements, or alternatively circular of similar dimensions. Both the conductors 21 and 22 may comprise, for example nickel-chromium alloy and are disposed directly on the respective face 11 and 12 of the film 10. This alloy is deposited by sputtering or evaporation to a thickness sufficient to provide a resistance per square in the range of 400 ohms to 760 ohms.

The film 10 is supported in the mounting arrangement 25 by an annular peripheral rim of the substrate 251 extending around the depression along at least most of each side. The substrate 251 which may be of, for example, moulded plastics material also comprises a plurality of bumps 252 distributed over the second face 12 of the film 10 to support the whole detector element area over the reflective surface 26 with the desired optical thickness d of gap 28. Although only two bumps 252 are shown in FIG. 7, a large number of these bumps 252 will normally be present to provide adequate support for the large central active-detector area of the film 10. The reflective surface 26 may be formed by a gold or other metal film on the bottom of the depression 28.

This arrangement of the film 10 on the substrate 251 is mounted on the header 256 of the TO-5 can 261 so that the film 10 is supported in the envelope space 260 of the can 261. This envelope space 260 may contain air or be evacuated or be filled with another gas. The can 261 has a window 300 (for example, a germanium window 300 to provide a daylight filter), through which passes the infrared radiation 31 to be detected. Thus, the window 300 allows substantially all the incident radiation in the intended operating wavelength range of 8 μm to 14 μm to pass therethrough. When the temperature of the pyroelectric film 10 changes locally owing to the absorption of thermal energy from incident radiation 31, charges are developed at opposed faces 11 and 12 of that region of the film 10. The conductors 21 and 22 function as optical elements in the absorption of the radiation 31 as described with reference to FIG. 3 and function electrically as capacitor electrodes for detecting these charges. The electrodes 21 and 22 which overlie and are substantially co-extensive with one another are supported by the film 10 and are located away from the peripheral edge of the film. Since charge generation within the pyroelectric film 10 is dependent on temperature changes of the film, incident radiation 31 must vary with time in order that it is detected. This may inherently be the case where the detection device is to respond to changes in an otherwise substantially unchanging environment as for example for intruder detection purposes. Alternatively it may be achieved by scanning the device across a scene being viewed or by chopping the incident radiation 31.

Electrical connection with the resistive electrode layers 21 and 22 is established by forming relatively narrow conductive tracks 121 and 122 on the respective surfaces 11 and 12 of the film 10. These tracks 121 and 122 contact the resistive electrode layers 21 and 22 at their one end and, as shown, lead to terminals at their other end which are electrically connected to the header 16 and a field effect transistor T, in a known manner. The FET forms part of an impedance matching circuit. The FET is coupled with the detector element 10,21, 22 in a circuit which includes a non-linear network D that protects the gate of the FET from excessive voltages. A fuller description of this type of circuit is to be found in United Kingdom Patent Specification GB-A-1 580 403. This circuit is mounted on the header 256 and so is located within the envelope space 260, although there is insufficient drawing room to show this in FIG. 7. By way of example, FIG. 7 shows electrical connection to the conductive track 121 being made via metallization extending on the side of the insulating ring 100. If desired, electrical connection to the conductive track 122 may be made via a metallization track extending on the side of the substrate 251, and this metallization track may even form an integral layer with the reflective film 26. Furthermore, if desired, a metallization track may extend on a bump 252 located below the resistive electrode layer 22 to form the connection to layer 22 (instead of providing the conductive track 122). A connection arrangement of this type is advantageous also for the individual bottom conductors 22 of a detector element array.

FIG. 8 illustrates one example of a FIG. 3 structure in which the film 10 provides an array of pyroelectric detector elements, for example for use as the image sensor in an inexpensive infrared camera. The array has a common first electrode 21 at the upper surface 11 of the film 10 and individual second electrodes 22 for each detector element at the bottom surface 12 of the film 10. These electrodes 21 and 22 may be formed of a nickel-chromium alloy, for example, and are sufficiently thin to provide a resistance per square in the range of 400 ohms to 760 ohms. The film 10 having an optical thickness of less than $\lambda s/4$ is mounted on a substrate 251 having bumps 252 which in this case electrically contact the individual electrodes 22 to form an electrical connection to the detector element. The desired optical thickness of the gap 28 between the electrodes 22 and the reflective surface 26 is maintained by these bumps 252.

The substrate 251 is of electrically conductive material (for example silicon) in this example and forms an interface between the detector element array and an underlying semiconductor circuit 255 (for example a monolithic silicon integrated circuit) which processes signals from the detector elements. Thus, for example, the circuit 255 may comprise field-effect transistors T, non-linear networks D and a switching matrix to permit sequential read-out of signals from individual detector-elements of the array. The conductive substrate 251 is divided by grooves 258 into an array of conductive pillars to form individual connections between each detector element and the circuit 255. This provides a comparatively simple connection scheme. The array of conductive pillars is held together by insulating material 259 at least at a part of the grooves 258 so as to form a substrate unit which can be handled with the film 10 mounted thereon, before mounting the substrate 251 on the circuit 255.

This mounting arrangement 25 of the device of FIG. 8 can be manufactured in the following steps. A continuous silicon wafer is first bonded to a continuous insulating film (for example of polyimide material). An array of holes 257 is etched in the polyimide film to expose areas of the silicon wafer. The upper surface of the silicon wafer is then etched to form the depression of depth d and to define the array of bumps 252, the height of which is the required gap 28 of depth d. The upper etched surface of the silicon wafer (including the bumps 252) is then provided with a metal coating of, for example, 2 ohm resistance per square so as to form the reflective surface 26. The grooves 258 may then be produced by sawing so as to reticulate the silicon wafer into the conductive pillars 251. The thin electroded pyroelectric film 10 is then mounted on the reticulated substrate 251 with the electrode 22 contacted by the metallized bumps 252.

This handleable assembly of the film 10 on the reticulated substrate 251 is then hybridised with the circuit substrate 255. This hybrid mounting may be achieved by lowering the film-substrate assembly onto solder bumps 253 or other connecting bumps present on contact pads 254 of the circuit 255 so that these pads 254 are connected to respective detector elements via the conductive pillars 251.

FIGS. 7 and 8 illustrate pyroelectric detector devices, and the thin pyroelectric films may be formed by a Langmuir-Blodgett process or for example as a very thin copolymer film by solvent casting. In the latter case the film requires poling by applying an electric field in known manner. An advantage of using a Langmuir-Blodgett process is that the film material can be deposited (on a support in a multiple-layer structure) to possess a spontaneous polarization (due to an inbuilt dipole moment) and a polar axis perpendicular to the plane of the film 10. Even when accumulative depositions are carried out to grow a thick Langmuir-Blodgett film on the support, the inbuilt dipole moment can be preserved through the thickness of the grown film.

The graphs of FIGS. 4 to 6 relate to situations in which both the first and second conductors 21 and 22 are immediately preceded by a space in the respective directions of the incoming radiation 31 and reflected radiation 32, as illustrated in FIG. 3. However, it is sometimes desirable (and may even be necessary in some cases) to support the active film 10 with an electrically-insulating support layer, for example in the case of very thin films 10 or with some Langmuir-Blodgett films 10 or liquid-crystal films 10. Such a support layer 15 may be, for example, a polyimide membrane or a silicon nitride layer. Thus, for example a Langmuir-Blodgett film 10 can be deposited on an insulating support layer on which either the first conductor 21 or the second conductor 22 has been formed before the Langmuir-Blodgett deposition. During the deposition, the support layer may itself be supported on a thicker substrate (for example a glass slide) in order to give more rigidity, after which the substrate may be removed.

This support layer 15 may then be retained as part of the multiple-layer structure in the final infrared detection device; thus, in this situation one of the first and second conductors 21 and 22 in the respective directions of the incoming radiation 31 and reflected radiation 32 is immediately preceded by a dielectric support layer 15 as illustrated in the respective FIGS. 12 and 13. The connection to conductor 21 in FIG. 12 and the connection to conductor 22 in FIG. 13 may be formed by metallisation at apertures through the support 15. With this modification the element structures of FIGS. 12 and 13 can be incorporated in device arrangements such as those illustrated in FIGS. 7 and 8.

Figure 9:
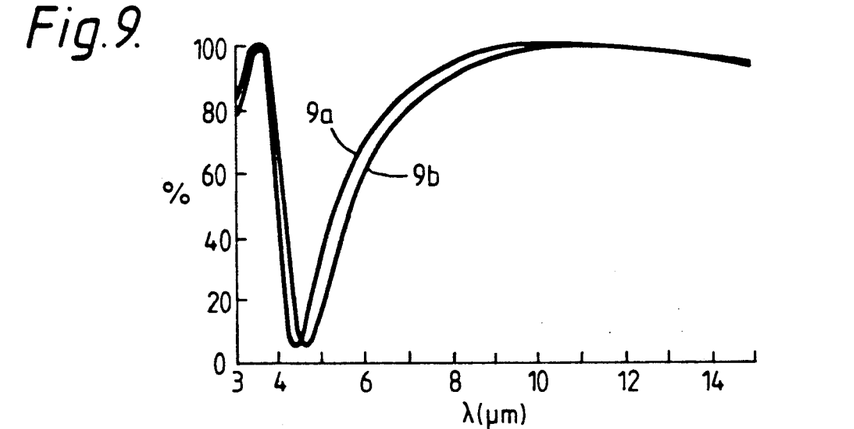
FIGS. 9 to 11 and FIG. 14 are graphs illustrating radiation absorption characteristics for detector device structures also including a support layer for the active film.
Figure 10:
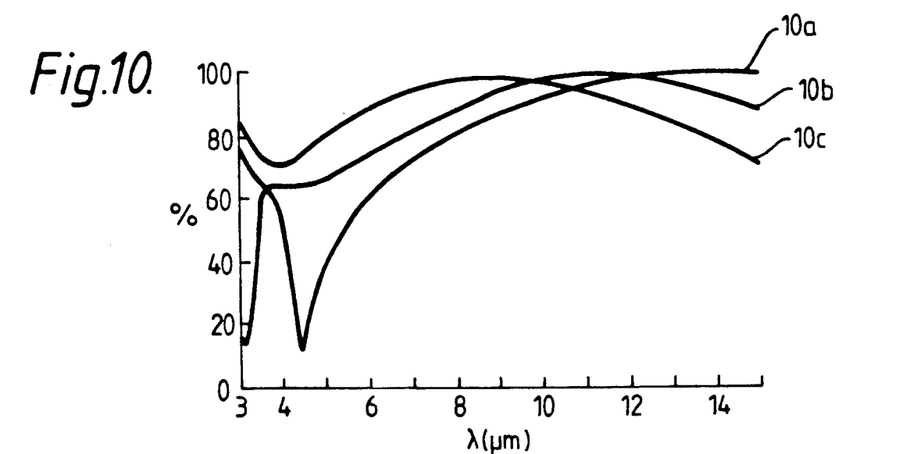
Figure 11:
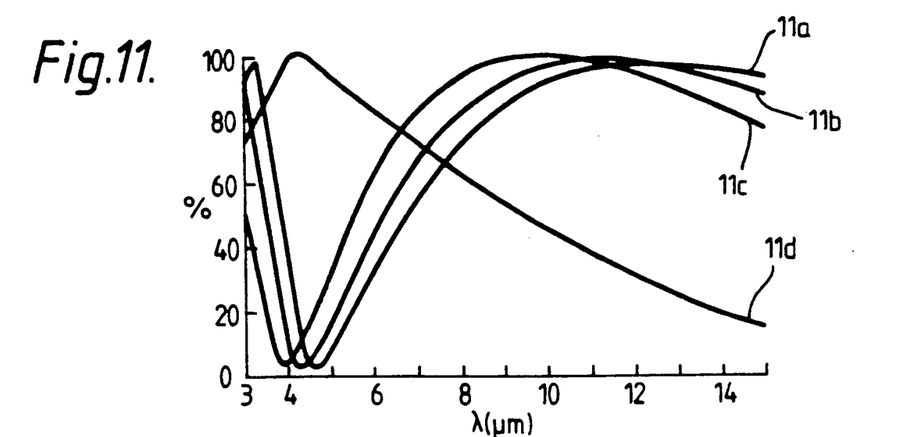
Figure 14:
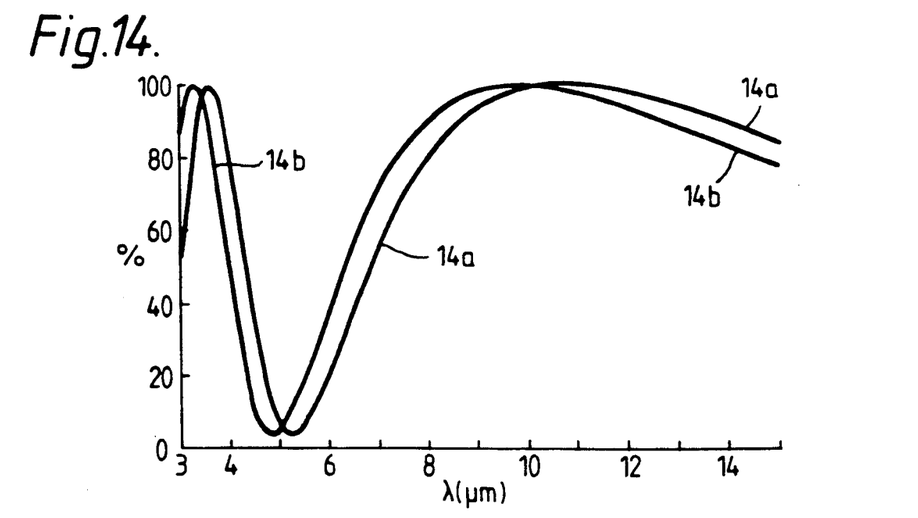

The graphs of FIGS. 9 to 11 relate to this element situation of FIGS. 12 and 13 having a dielectric support layer 15 and retaining the gap 28. FIG. 14 relates to a modification without the gap 28. In the simplified computer model used to generate these graphs it was assumed that the spectral transmission/absorption of the radiation 31,32 by the support layer and the refractive index of the support layer are both constant over the given wavelength range. An arbitrary value of 1.8 was chosen for the refractive index (N) of the support layer.

For all the plots of FIGS. 9 to 11 and FIG. 14, the following parameters were maintained constant:
- 0.1 μm—for thickness t of active film 10
- 1.8—for refractive index of active film 10
- 754Ω—for resistance Z of conductors 21 and 22
- 2Ω—for reflective surface layer 26.

In the case of FIG. 9, the thickness d of the air gap 28 and the thickness T of the support layer 15 were as follows:
- d = 2.14 μm
- T = 0.1 μm Curve 9a in FIG. 9 relates to the FIG. 12 case of the support layer 15 being in front of the active film 10 so that the top conductor 21 is sandwiched between the support layer 15 and the film 10. Curve 9b relates to the FIG. 13 case where the support layer 15 is behind the active film so that it is in the path of the reflected radiation 32 and the back conductor 22 is sandwiched between the support layer 15 and the film 10. There is found to be a very small lateral displacement between the curves 9a and 9b, but the absorption over the wavelength band 8 μm to 14 μm is extremely good and substantially the same regardless of whether the thin support layer 15 is present on the front or on the back of the film 10 or even absent from the film 10. In this case, the sum (n·t + N·T + d) of the optical thicknesses of the multiple-layer structure including the gap 28 corresponds to a quarter of a wavelength of 10 μm, and the absorption is found to be maximum around this value.

In the FIG. 9 embodiments the support layer 15 was of the same thickness as the active film 10. However, it may often be desirable to increase the support for the film 10 by having a support layer 15 with a thickness larger than that of the film 10. By way of example all the plots of FIGS. 10 and 11 are for a support layer 15 thickness of 0.5 μm. An even larger thickness may be used depending on the material properties of the layer, but in order to reduce the thermal capacitance and heat conduction laterally along the support layer it is often desirable for the support layer thickness to be at most approximately 0.5 μm.

FIG. 10 relates to the FIG. 12 situation of a 0.5 μm thick support layer 15 in front of the active film 10 with the top conductor 21 sandwiched therebetween. The different curves 10a to 10c are for the following different values of the thickness d of the air gap 28:

| curve 10a: | d = 2.14 μm. |
|---|---|
| curve 10b: | d = 1.50 μm. |
| curve 10c: | d = 1.00 μm. |

Curve 10a shows that unless the thickness d of the air gap 28 is reduced to compensate for the inclusion of a thick front support layer, the absorption is poor over the 8 μm to 14 μm wavelength band, especially poor at the 8 μm end. In this case the sum (n·t + NT + d) corresponds to a quarter of a wavelength of 12.8 μm which is in the upper half of the wavelength range of 8 μm to 14 μm.

Curve 10b shows that the absorption is considerably improved by making the air gap smaller (1.5 μm instead of 2.14 μm). In this case the sum (n·t + N·T + d) corresponds to a wavelength of 10.3 μm which is in the lower half of the range of 8 μm to 14 μm. Reducing the air gap 28 to an even smaller thickness (curve 10c) still results in the absorption being good although slightly lower over the upper half of the wavelength range. In this case the sum (n·t + N·T + d) corresponds to a quarter of a wavelength of 8.3 μm.

FIG. 11 relates to the FIG. 13 situation of a 0.5 μm thick support layer 15 behind the active film 10 with the back conductor 22 sandwiched therebetween. The support layer 15 is now in the path of the reflected radiation 32, and the air gap 28 of thickness d is present between the support layer 15 and the reflective surface 26. The thickness d of this gap 28 is reduced to compensate for the inclusion of the support layer 15. The different curves 11a to 11d are for the following different values of the thickness d:

| curve 11a: | 1.46 μm. |
|---|---|
| curve 11b: | 1.20 μm. |
| curve 11c: | 0.90 μm. |
| curve 11d: | zero, i.e. no air gap. |

The absorption over the 8 μm to 14 μm wavelength band is good for all three curves 11a to 11c, with the maximum-absorption shifting to the low wavelength end as the thickness d of the gap is reduced. For both curves 11a and 11b the sum (n·t + N·T + d) corresponds to a quarter of a wavelength in the lower half of the range 8 μm to 14 μm, whereas for curve 11c the sum (n·t + N·T + d) corresponds to a quarter of a wavelength (7.92 μm) just below the range.

Curve 11d relates to a situation which is not in accordance with the present invention. In this case, the reflective surface 26 is provided directly on the back of the 0.5 μm thick support layer, i.e. there is no gap 28. As can be seen from curve 11d the absorption in this case is extremely poor for the 8 μm to 14 μm wavelength band. This indicates the importance of including the gap 28 in the FIG. 13 device structure so that the sum of optical thicknesses over the multiple-layer structure to the reflector 26 is approximately a quarter of λs. However, as illustrated in FIG. 14, fairly good absorption can be obtained again even in this situation by increasing the thickness of the rear support layer 15 to compensate for the omission of the air gap 28 from the FIG. 13 element structure.

Thus, the FIG. 14 graphs are for this modified FIG. 13 situation with the following parameters:
- 0.1 μm—for thickness t of film 10
- 1.8—for refractive index of film 10
- 1.8—for refractive index of support layer 15
- 754Ω—for resistance Z of conductors 21 and 22
- 2Ω—for reflective layer 26 on rear surface of the support layer 15.

For curve 14a the thickness T of the support layer 15 is 1.389 μm, so that its optical thickness is a quarter of λs of 10 μm (at about which the absorption is a maximum), whereas the sum (N·T + n·t) is about a quarter of a 10.7 μm wavelength. For curve 14b, the thickness T is 1.289 μm so that the sum (N·T + n·t) is a quarter of λs of 10 μm in this case. However, the increased thickness of material in the element structures of curves 14a and 14b is a disadvantage in increasing significantly the thermal capacity of the detector element and the thermal conduction to and from the element.

In most infrared detector devices manufactured in accordance with the invention, the material of the film 10 and the design and circuit operation of the detector elements are likely to be chosen so as to utilize a conventional pyroelectric effect in which when a temperature change occurs (for example upon absorption of incident infrared radiation 31) in a polar crystalline (structured) material exhibiting spontaneous polarization, the material generates electric charges at its opposite faces. By arranging the pyroelectric material in known manner as a capacitor (with electrodes 21 and 22 at the opposite faces) in a suitable amplifying circuit, a current or voltage signal can be developed and detected. Most of the useful pyroelectric materials are also ferroelectric and exhibit their pyroelectric properties in the ferroelectric phase below their Curie point transition temperature. However, infrared detectors may also be constructed in known manner using ferroelectric polymer materials operating in the region of their Curie point where their dielectric constant changes rapidly with temperature. Such ferroelectric infrared detector elements may also be constructed as capacitors with electrode connections at opposite faces 21 and 22. Both these pyroelectric and ferroelectric polymer types of detector elements can be manufactured and mounted in accordance with the present invention. It is also possible to manufacture other types of infrared detection devices in accordance with the invention, for example polymer liquid-crystal devices.

From reading the present disclosure, other variations will be apparent to persons skilled in the art. Such variations may involve equivalents and other features which are already known in the design, manufacture and use of infrared detection devices, absorbers and reflectors, and film-mount arrangements and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An infrared detection device for detecting infrared radiation in a given wavelength range comprising an array of detector elements having a multiple-layer structure along the path of the radiation,
    a flexible film having a temperature-dependent characteristic and having opposite first and second faces in the multiple-layer structure,
    at least one first conductor at the first face facing the incoming radiation and comprising a resistive layer which provides a sufficient effective resistance per square as to absorb a substantial proportion of incident radiation in said wavelength range,
    an array of second electrical conductors which are located at the opposite second face of the film to form the detector elements in the film,
    a reflector having a reflective surface which faces the second face of the film and which is present behind the film to reflect radiation transmitted by the film, the reflective surface being separated from at least most of the area of the second conductor at the second face of the film by a separation along the path of the radiation, which separation comprises a space-forming gap adjacent to the reflector,
    a plurality of bumps present at the reflector to form spaced supporting elements which are located below the film to support the film with its conductors over the reflective surface, the gap having a desired optical thickness determined by the height of the bumps above the reflective surface, a respective bump carrying below the film an electrical connection to a respective second conductor of each detector element,
    the optical thickness of the film between the first and second conductors being less than one quarter of a selected wavelength of said wavelength range,
    the sum of the optical thicknesses of the multiple-layer structure (including the film and said gap) along the radiation path to the reflective surface being approximately one quarter of said selected wavelength,
    and the second conductor which faces the reflective surface comprising a resistive layer which provides a sufficient effective resistance per square as to absorb a substantial proportion of reflected radiation in said wavelength range.

2. A device as claimed in claim 1 wherein the resistive layer of one or both of the first and second conductors in the respective directions of the incoming radiation and reflected radiation is immediately preceded by a space and provides a resistance per square which is in the range between Zo and approximately 2.Zo, where Zo is the characteristic impedance of free space.

3. A device as claimed in claim 1, further characterized in that the film is at most 0.5 micrometers thick.

4. A device as claimed in claim 1 wherein at least one of the first and second conductors in the respective directions of the incoming radiation and reflected radiation is immediately preceded by an electrically-insulating support layer which supports the film and which forms part of the multiple-layer structure.

5. A device as claimed in claim 4, wherein the support layer has a thickness which is larger than that of the film and which is at most 0.5 micrometers, and in that the multiple-layer structure includes a space-forming gap in front of the reflector.

6. A device as claimed in claim 1, wherein the bumps are formed in a substrate of electrically conductive material and the substrate forms an interface between the array of detector elements and an underlying semiconductor circuit which processes signals from the detector elements, in that the substrate is divided by grooves into an array of conductive pillars to form individual connections between each detector element and the circuit, and in that the array of conductive pillars is held together by electrically insulating material at least at a part of the grooves.

7. A device as claimed in claim 1 wherein the said selected wavelength is such that the absorption of incident radiation is substantially maximized over the said wavelength range, and in that the said wavelength range is approximately 8 $\mu$m to 14 $\mu$m.

8. A device as claimed in claim 1 wherein the temperature-dependent film is a Langmuir-Blodgett film with ferroelectric and/or pyroelectric properties.

9. An infrared detection device for detecting infrared radiation in a given wavelength range comprising at least one detector element having a multiple-layer structure along the path of the radiation, a flexible film having a temperature-dependent characteristic in the multiple-layer structure, first and second electrical conductors which are located at responsive opposite first and second faces of the film to form the detector element in the film, which first conductor at the first face facing the incoming radiation comprises a resistive layer providing a sufficient effective resistance per square as to absorb a substantial proportion of incident radiation in said wavelength range, a plurality of spaced supporting elements on which the multiple-layer structure is mounted, at least one of which supporting elements carries below the film an electrical connection for the second conductor of the detector element, a reflector which faces the second face of the film and which is present behind the film to reflect radiation transmitted by the film, an electrically-insulating support layer which supports the film and forms part of the multiple-layer structure adjacent to the second conductor, the reflector being formed by a reflector surface layer on a face of the support layer remote from the film, and so the support layer providing a separation of a desired optical thickness between the reflector and at least most of the area of the second conductor, the optical thickness of the film between the first and second conductors being less than one quarter of a selected wavelength of said wavelength range, the sum of the optical thicknesses of the multiple-layer structure (including the film and the support layer) along the radiation path to the reflective surface being approximately one quarter of said selected wavelength, and the second conductor which faces the reflective surface comprising a resistive layer which provides a sufficient effective resistance per square as to absorb a substantial proportion of reflected radiation in said wavelength range.

* * * * *